(12) United States Patent
Park et al.

(10) Patent No.: US 11,903,238 B2
(45) Date of Patent: Feb. 13, 2024

(54) DISPLAY DEVICE AND METHOD FOR FABRICATING THE SAME

(71) Applicant: LG Display Co., Ltd., Seoul (KR)

(72) Inventors: Chan Park, Gumi-si (KR); MoonGoo Kim, Paju-si (KR); HyunWoo Cho, Gumi-si (KR); Wooseok Roh, Gumi-si (KR); HeungJu Jo, Paju-si (KR); JeongKweon Park, Paju-si (KR); SangGul Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 355 days.

(21) Appl. No.: 16/674,321

(22) Filed: Nov. 5, 2019

(65) Prior Publication Data

US 2020/0152842 A1 May 14, 2020

(30) Foreign Application Priority Data

Nov. 9, 2018 (KR) ........................ 10-2018-0137362

(51) Int. Cl.
*H10K 50/844* (2023.01)
*H10K 59/12* (2023.01)
*H10K 77/10* (2023.01)
*H10K 102/00* (2023.01)

(52) U.S. Cl.
CPC .......... *H10K 50/844* (2023.02); *H10K 59/12* (2023.02); *H10K 77/111* (2023.02); *H10K 2102/311* (2023.02)

(58) Field of Classification Search
CPC .......... H01L 51/50–56; H01L 51/5237–5259; H10K 50/84–846; H10K 59/87–874; H10K 59/12–1315
See application file for complete search history.

(56) References Cited

U.S. PATENT DOCUMENTS

| | | |
|---|---|---|
| 9,406,905 B2 | 8/2016 | Park et al. |
| 10,121,842 B2 | 11/2018 | Lee et al. |
| 10,199,448 B2 | 2/2019 | Kim et al. |
| 2017/0148856 A1 | 5/2017 | Choi et al. |
| 2017/0237038 A1 | 8/2017 | Kim et al. |
| 2017/0287992 A1 | 10/2017 | Kwak et al. |
| 2018/0069063 A1 | 3/2018 | Kim et al. |

(Continued)

FOREIGN PATENT DOCUMENTS

| | | |
|---|---|---|
| CN | 105742321 A | 7/2016 |
| CN | 107799659 A | 3/2018 |

(Continued)

*Primary Examiner* — Lauren R Bell
(74) *Attorney, Agent, or Firm* — Seed IP Law Group LLP

(57) ABSTRACT

Provided is a display device. The display device includes a flexible substrate comprising an active area, and a non-active area surrounding a border of the active area; a thin-film transistor and a light-emitting element on the active area; an encapsulation unit over the thin-film transistor and the light-emitting element; a hole formed in the active area by removing a portion of the flexible substrate; a first common layer disposed on a side surface of the hole, extended from the light-emitting element and comprising same elements with the light-emitting element; and a tip protruding from the side surface of the hole. The first common layer disposed adjacent to the tip is disconnected from the light-emitting element.

6 Claims, 9 Drawing Sheets

(56) References Cited

U.S. PATENT DOCUMENTS

| | | | |
|---|---|---|---|
| 2018/0151834 A1 | 5/2018 | Kanaya | |
| 2018/0294436 A1 | 10/2018 | Choi et al. | |
| 2019/0081273 A1* | 3/2019 | Sung | H01L 51/5253 |
| 2019/0288047 A1* | 9/2019 | Jeong | H01L 51/5253 |
| 2020/0073500 A1* | 3/2020 | Jeong | H01L 27/3244 |
| 2020/0106046 A1* | 4/2020 | Kim | H01L 51/0097 |

FOREIGN PATENT DOCUMENTS

| | | |
|---|---|---|
| CN | 107808896 A | 3/2018 |
| CN | 108681131 A | 10/2018 |
| CN | 109509769 A | 3/2019 |
| KR | 20140137950 A | 12/2014 |
| KR | 20160080310 A | 7/2016 |
| KR | 20170059864 A | 5/2017 |
| KR | 20170111827 A | 10/2017 |
| KR | 20170128742 A | 11/2017 |
| KR | 20180002126 A | 1/2018 |
| KR | 20180026599 A | 3/2018 |
| KR | 20180115387 A | 10/2018 |
| KR | 20190029830 A | 3/2019 |

* cited by examiner

DISPLAY DEVICE AND METHOD FOR FABRICATING THE SAME

CROSS-REFERENCE TO RELATED APPLICATIONS

This application claims the benefit and priority to Korean Patent Application No. 10-2018-0137362, filed on Nov. 9, 2018, in the Korean Intellectual Property Office, the disclosure of which is herein incorporated by reference.

BACKGROUND

Technical Field

The present disclosure relates to a display device and a method of fabricating the same, and more particularly, to a display device including a hole in an active area and a method of fabricating the same.

Description of the Related Art

As the era of information technology has truly begun, the field of display devices has been rapidly grown up that represents information contained in electrical signals in the form of visual images. Display devices are employed in a variety of electronic devices such as a smart phone, a tablet PC, a laptop computer, a monitor and a television.

Such display devices include a liquid-crystal display (LCD) device, a field emission display (FED) device, an organic light emitting display (OLED) device, etc.

A field emission display (FED) device including an organic light-emitting display (OLED) device is cable of producing light in its own and thus does not require an additional light source, unlike a liquid-crystal display (LCD) device. Therefore, it can be made lighter and thinner than an LCD device. In addition, a field emission display (FED) device has advantages in that it is driven with low voltage to consume less power, and in that it represents vivid colors and has short response time, wide viewing angle and good contrast ratio (CR). For these reasons, a field emission display device finds more and more applications.

In a field emission display device, an emissive layer (EML) using an organic material is disposed between two electrodes, e.g., an anode and a cathode. Holes in the anode are injected into the emissive layer, and electrons in the cathode are injected into the emissive layer, such that the electrons and the holes are recombined to form excitons in the emissive layer, and light is emitted therefrom.

Host materials and dopant materials are included in the emissive layer so that the two materials interact. The host materials generate excitons from electrons and holes and transfer energy to the dopant materials. As the dopant materials, a small amount of dye organic materials are added. The dopant materials receive energy from the host materials to convert it into light.

BRIEF SUMMARY

Recently, demand for portable electronic devices such as smart phones and tablet PCs has increased greatly. Portable electronic devices such as smart phones and tablet PCs can be used in a variety of applications by being equipped with capturing capability like a camera, audio capability and memo capability as well as communications capability like a telephone.

A display device used for a portable electronic device such as a smart phone and a tablet PC is becoming larger for the sake of user convenience. However, the size of the portable electronic device has to be limited so that a user can easily carry it.

Recently, in order to enlarge the size of a display device while allowing the user to carry it easily, there are approaches that the corners of the display device is chamfered, or that a hole is formed in the active area A/A where images are actually displayed and modules performing a variety of features such as a camera and a sensor are disposed under the display device and exposed via the hole, and so on.

Unfortunately, when a hole is formed in the active area of a display device, the hole area may become vulnerable to moisture or contaminants permeating from the outside. Therefore, it is necessary to improve the structure of the display device.

Accordingly, the inventors of the present disclosure have devised a display device having a novel structure that can suppress permeation of moisture or contaminants from the outside through the hole area by way of improving the structure of the display device in which a hole is formed in the active area.

Objects of the present disclosure are not limited to the above-mentioned objects, and other objects, which are not mentioned above, may be clearly understood by those skilled in the art from the following descriptions.

According to an aspect of the present disclosure, there is provided a display device including: a flexible substrate comprising an active area, and a non-active area surrounding a border of the active area; a thin-film transistor and a light-emitting element on the active area; an encapsulation unit over the thin-film transistor and the light-emitting element; a hole formed in the active area by removing a portion of the flexible substrate; a first common layer disposed on a side surface of the hole, extended from the light-emitting element and comprising same elements with the light-emitting element; and a tip protruding from the side surface of the hole. The first common layer disposed adjacent to the tip is disconnected from the light-emitting element.

According to another aspect of the present disclosure, there is provided a method of fabricating a display device, the method comprising: forming a flexible substrate on a supporting substrate, the flexible substrate comprising an active area and a non-active area surrounding a border of the active area; forming a thin-film transistor on the active area; forming a groove by irradiating a portion of the active area with a laser to remove a portion of the flexible substrate and the thin-film transistor; forming a light-emitting element on the flexible substrate and the thin-film transistor and forming a first common layer on a side surface of the groove, the first common layer being extended from the light-emitting element and comprising same elements as the light-emitting element; forming an encapsulation unit on the light-emitting element; and forming a hole from the groove by removing the supporting substrate. The forming the groove further includes forming a tip protruding from the side surface of the groove, and the first common layer disposed adjacent to the tip is disconnected from the light-emitting element.

According to an exemplary embodiment of the present disclosure, it is possible to prevent permeation of moisture that may occur in a hole area in an active area of a display device included in a portable electronic device.

According to an exemplary embodiment of the present disclosure, it is possible to enlarge the size of a display device of a portable electronic device while allowing the user to carry it easily by way of forming a hole in an active area of the display device and disposing modules such as a camera and a sensor under the display device so that they are exposed through the hole.

The effects according to the present disclosure are not limited to the contents exemplified above, and more various effects are included in the present specification.

BRIEF DESCRIPTION OF THE SEVERAL VIEWS OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
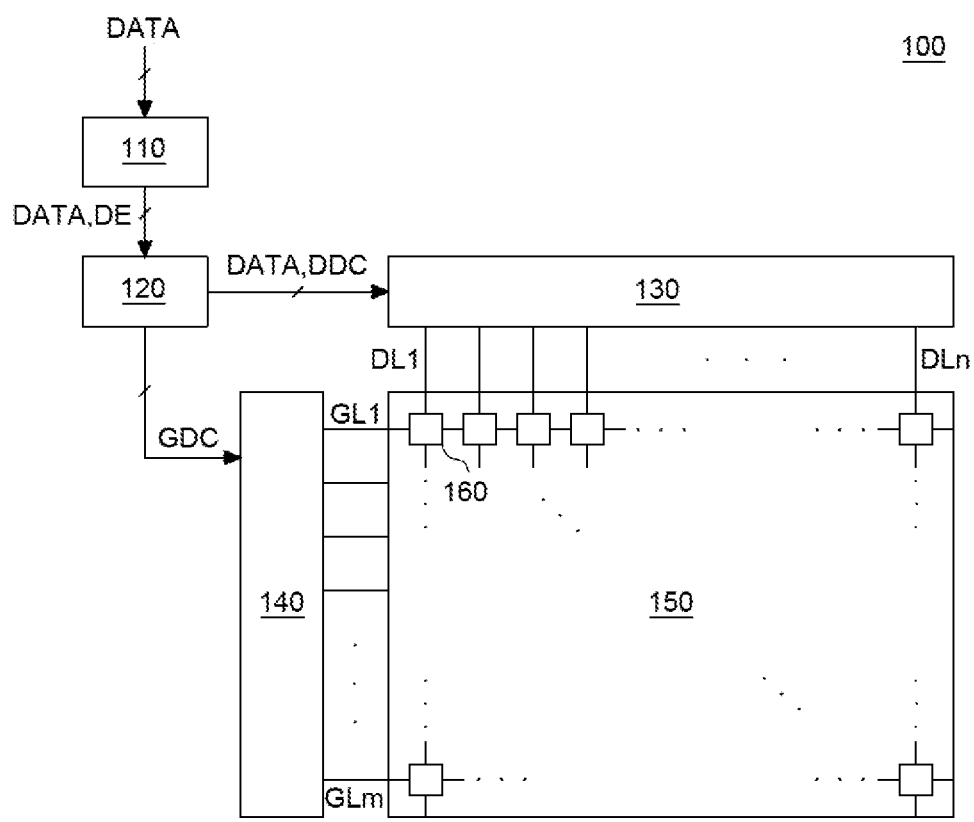
FIG. 1 is a block diagram of a display device according to an exemplary embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, it may be directly on another layer or another element, or other element or layer may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 is a block diagram of a display device according to an exemplary embodiment of the present disclosure.

A field emission display device is employed as the display device 100 in the example shown in FIG. 1, this is merely illustrative.

Referring to FIG. 1, the display device 100 includes an image processor 110, a timing controller 120, a data driver 130, a gate driver 140 and a display panel 150.

The image processor 110 outputs a data signal DATA supplied from the outside as well as a data enable signal DE. The image processor 110 may output at least one of a vertical synchronization signal, a horizontal synchronization signal and a clock signal in addition to the data enable signal DE.

The timing controller 120 receives the data signal DATA as well as the data enable signal DE or driving signals including the vertical synchronization signal, the horizontal synchronization signal and the clock signal from the image processor 110. The timing controller 120 outputs a gate timing control signal GDC for controlling the operation timing of the gate driver 140, and a data timing control signal DDC for controlling the operation timing of the data driver 130 based on the driving signals.

The data driver 130 samples and latches the data signal DATA supplied from the timing controller 120 in response to the data timing control signal DDC supplied from the timing controller 120 and converts it into a gamma reference voltage. The data driver 130 outputs the data signal DATA through data lines DL1 to DLn.

The gate driver 140 outputs a gate signal while shifting the level of the gate voltage in response to the gate timing control signal GDC supplied from the timing controller 120. The gate driver 140 outputs the gate signal through gate lines GL1 to GLm.

The display panel 150 displays images as the pixel 160 emits light in response to the data signal DATA and the gate signal supplied from the data driver 130 and the gate driver 140, respectively. The structure of the pixel 160 will be described in detail with reference to FIGS. 2 and 4.

Figure 2:
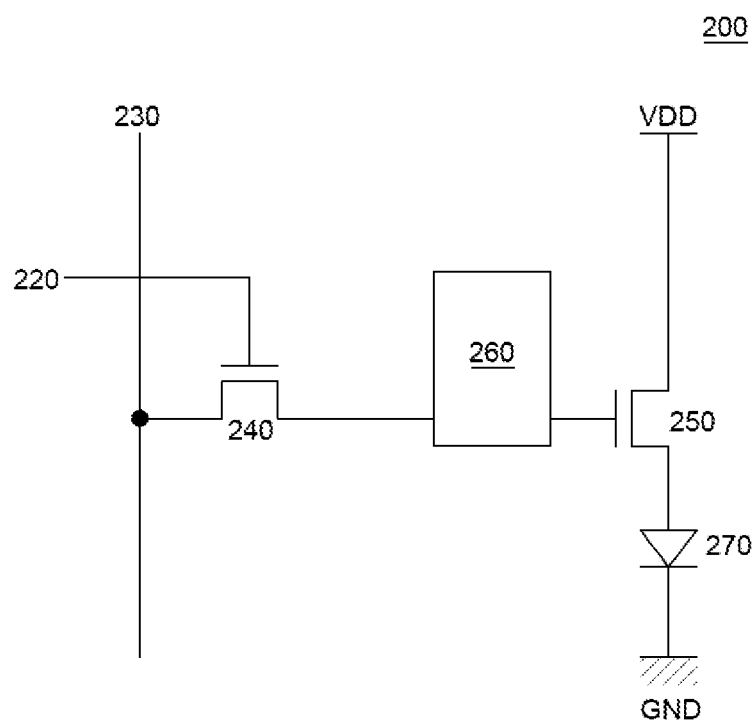
FIG. 2 is a circuit diagram of a pixel of a display device according to an exemplary embodiment of the present disclosure.

FIG. 2 is a circuit diagram of a pixel of a display device according to an exemplary embodiment of the present disclosure.

The pixel included in a display device 200 described with reference to FIG. 2 is a pixel included in the field emission display device, but the present disclosure is not limited thereto.

Referring to FIG. 2, the pixel included in the display device 200 includes a switching transistor 240, a driving transistor 250, a compensation circuit 260, and a light-emitting element 270.

The light-emitting element 270 operates to emit light in proportion to the driving current generated by the driving transistor 250.

The switching transistor 240 is switched on/off so that a data signal supplied through the data line 230 in response to the gate signal supplied through the gate line 220 is stored in the capacitor as a data voltage.

The driving transistor 250 operates so that a constant driving current flows between a high supply voltage line VDD and a low supply voltage line GND in response to the data voltage stored in the capacitor.

The compensation circuit 260 is for compensating the threshold voltage of the driving transistor 250, for example. The compensation circuit 260 includes at least one thin-film transistor and a capacitor. The configuration of the compensation circuit may vary in a variety of ways depending on the compensation manner.

The pixel of the field emission display device 200 is implemented as a 2T (transistor) 1C (capacitor) structure including a switching transistor 240, a driving transistor 250, a capacitor and a light-emitting element 270. When the compensation circuit 260 is added, the pixel may be implemented as a variety of structures such as 3T1C, 4T2C, 5T2C, 6T1C, 6T2C, 7T1C, 7T2C, and so on.

Figure 3:
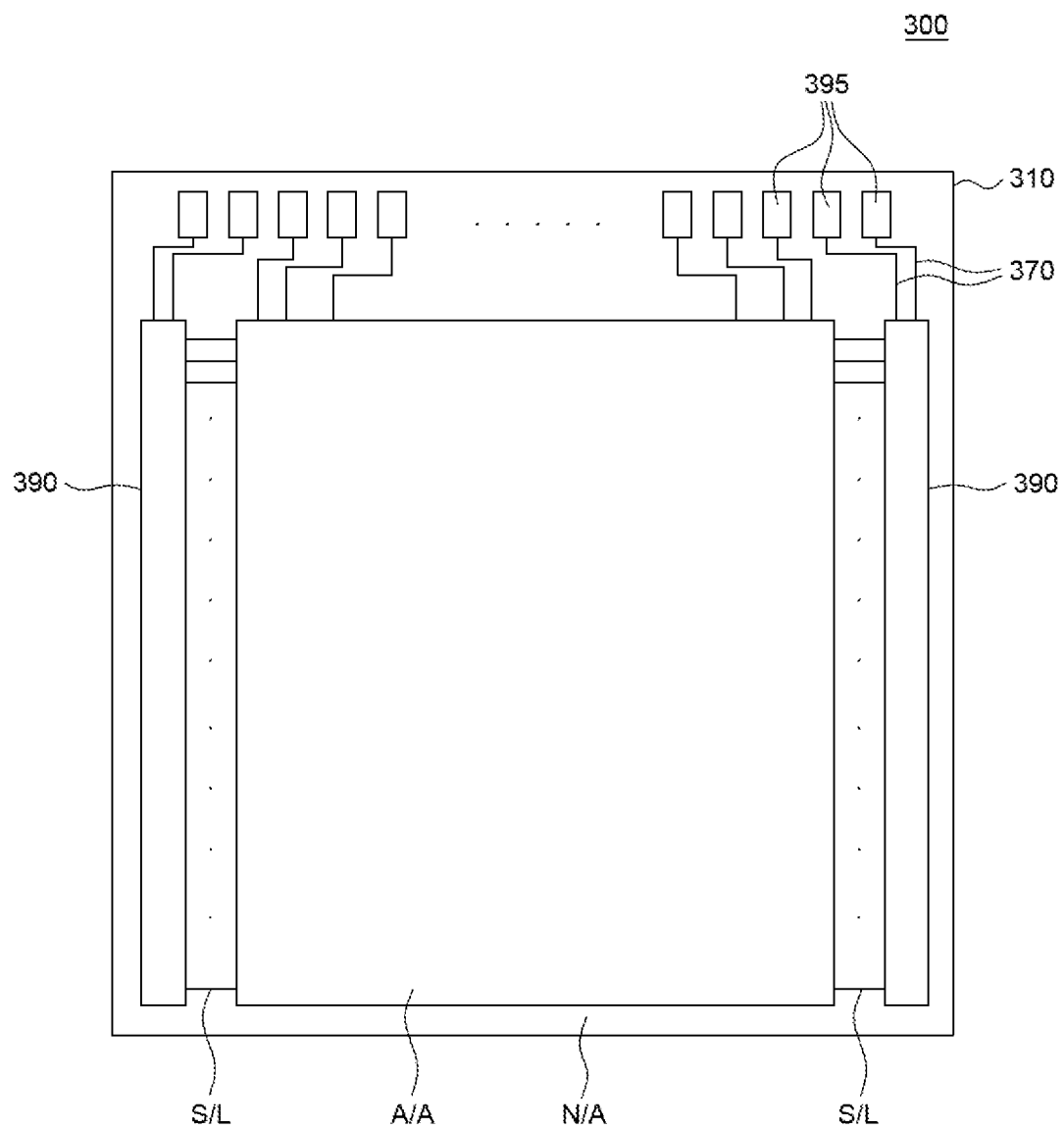
FIG. 3 is a plan view of a display device according to an exemplary embodiment of the present disclosure.

FIG. 3 is a plan view of a display device according to an exemplary embodiment of the present disclosure.

A field emission display device is described as an example of the display device in FIG. 3, this is merely illustrative.

Referring to FIG. 3, a display device 300 includes an active area A/A where pixels for emitting light by a thin-film transistor and a light-emitting element disposed on a substrate 310 are disposed, and a non-active area N/A surrounding the border of the active area A/A.

In the non-active area N/A of the substrate 310, circuitry such as a gate driver 390 for driving the display device 300, and a variety of signal lines such as scan lines S/L may be disposed. The circuitry for driving may be disposed on the substrate 310 as a gate in panel (GIP) or may be connected to the substrate 310 as a tape carrier package (TCP) or a chip on film (COF).

Pads 395 are disposed on one side of the substrate 310 of the non-active area N/A. The pads 395 are a metal pattern to which an external module is bonded.

A variety of lines are formed on the substrate 310. The lines may be formed in the active area A/A of the substrate 310. Alternatively, circuit lines 370 formed in the non-active area N/A may transfer signals by connecting a driving circuit, a gate driver, a data driver, or the like.

The circuit lines 370 are formed of a conductive material and may be formed of a conductive material having excellent flexibility to suppress cracks from occurring when the substrate 310 is bent. For example, the circuit lines 370 may be formed of a conductive material having excellent flexibility such as gold (Au), silver (Ag) and aluminum (Al).

The circuit lines 370 may be formed of a variety of conductive materials used in the active area A/A. The circuit lines 370 may be formed of molybdenum (Mo), chrome (Cr), titanium (Ti), nickel (Ni), neodymium (Nd), copper (Cu), an alloy of silver (Ag) and magnesium (Mg), etc.

The circuit lines 370 may be made up of a multilayer structure including various conductive materials. For example, circuit lines 370 may be made up of, but is not limited to, a three-layer structure of titanium (Ti)/aluminum (Al)/titanium (Ti).

Figure 4:
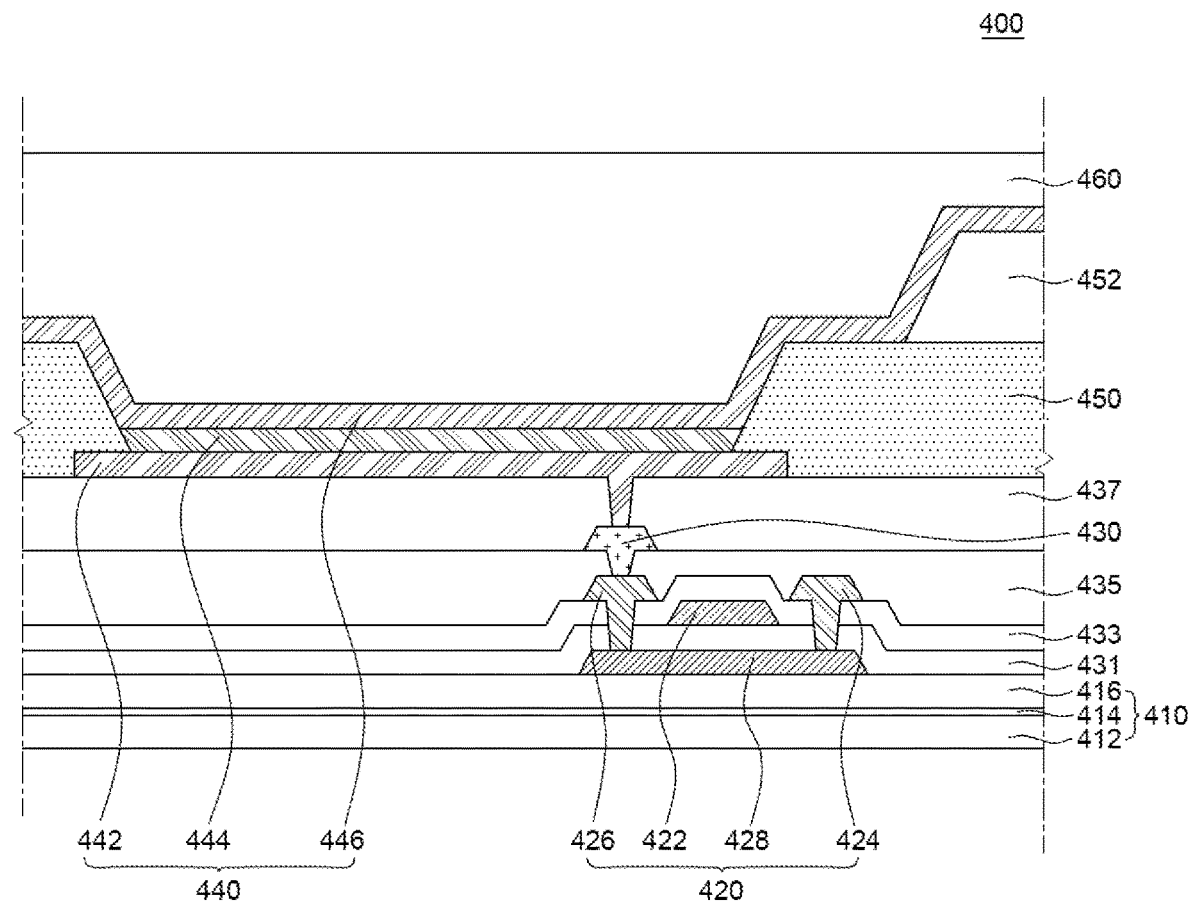
FIG. 4 is a cross-sectional view of an active area of a display device according to an exemplary embodiment of the present disclosure.

FIG. 4 is a cross-sectional view of an active area of a display device according to an exemplary embodiment of the present disclosure.

A field emission display device is employed as a display device 400 in the example shown in FIG. 4, this is merely illustrative.

Referring to FIG. 4, a substrate 410 serves to support and protect the elements of the display device 400 disposed thereon. The substrate 410 may be made of a flexible material recently and thus may be a flexible substrate. The substrate 410 may be implemented in the form of a film including one of a polyester polymer, a silicon polymer, an acrylic polymer, a polyolefin polymer, and a copolymer thereof.

For example, the substrate 410 may be made of at least one selected from the group consisting of: polyethylene terephthalate (PET), polybutylene terephthalate (PBT), polysilane, polysiloxane, polysilazane, polycarbosilane, polyacrylate, polymethacrylate, polymethylacrylate, polymethylmetacrylate, polyethylacrylate, polyethylmetacrylate, cyclic olefin copolymer (COC), cyclic olefin polymer (COP), polyethylene (PE), polypropylene (PP), polyimide (PI), polymethyl methacrylate (PMMA), polystyrene (PS), polyacetal (POM), polyetheretherketone (PEEK), polyester sulfone (PES), polytetrafluoroethylene (PTFE), polyvinyl chloride (PVC), polycarbonate (PC), polyvinylidene fluoride (PVDF), perfluoroalkyl polymer (PFA), styrene acrylonitrile polymer (SAN) and combinations thereof.

The substrate 410 may be made up of multiple layers including a first substrate layer 412 and a second substrate layer 416, and a substrate protecting layer 414 may be disposed between the first substrate layer 412 and the second substrate layer 416 to prevent moisture and contaminants from permeating.

A supporting substrate made of glass may be disposed under a flexible substrate during the fabricating process, and the supporting substrate may be released after the fabricating process is completed.

A buffer layer may be further disposed on the substrate 410. The buffer layer can prevent permeation of moisture or contaminants through the substrate 410 and provide a flat surface over the substrate 410. It is to be noted that the buffer layer is not an essential element and may be eliminated depending on type of the substrate 410 or the type of the thin-film transistor 420 disposed on the substrate 410.

The thin-film transistor 420 disposed on the substrate 410 includes a gate electrode 422, a source electrode 424, a drain electrode 426, and a semiconductor layer 428.

The semiconductor layer 428 may be made of, but is not limited to, an amorphous silicon or polycrystalline silicon that has a higher mobility than amorphous silicon and thus has low energy consumption and excellent reliability, which can be applied to the thin-film transistor in a pixel.

The semiconductor layer 428 may be made of oxide semiconductor. Oxide semiconductor exhibits excellent mobility and uniformity. The oxide semiconductor may include: quaternary metallic oxide such as indium-tin-gallium-zinc-oxide (InSnGaZnO) based material; ternary metal oxide such as indium-gallium-zinc-oxide (InGaZnO) based material, indium-tin-zinc-oxide (InSnZnO) based material, indium-aluminum-zinc-oxide (InAlZnO) based material, tin-gallium-zinc-oxide (SnGaZnO) based material, aluminum-gallium-zinc-oxide (AlGaZnO) based material, and tin-aluminum-zinc-oxide based (SnAlZnO) material; binary metal oxide such as indium-zinc-oxide (InZnO) based material, tin-zinc-oxide (SnZnO) based material, aluminum-zinc-oxide (AlZnO) based material, zinc-magnesium-oxide (ZnMgO) based material, tin-magnesium-oxide (SnMgO) based material, indium-magnesium-oxide (InMgO) based material, and indium-gallium-oxide (InGaO) based material; and mono metal oxide such as indium-oxide (InO) based material, tin-oxide (SnO) material, and zinc-oxide (ZnO) based material. The semiconductor layer 428 may be made of the above-listed materials. The composition ratios among elements are not limited to specific values.

The semiconductor layer 428 may include a source region and a drain region containing p-type or n-type impurities, and a channel region between the source region and the drain region, and may include lightly doped regions between the channel region and the source and drain regions adjacent thereto.

The source region and the drain region are highly doped with the impurities, and the source electrode 424 and the drain electrode 426 of the thin-film transistor 420 are connected to them, respectively. P-type impurities or n-type impurities may be used for the impurity ions. The p-type impurities may be one of boron (B), aluminum (Al), gallium (Ga) and indium (In), and the n-type impurities may be one of phosphorus (P), arsenic (As) and antimony (Sb).

The semiconductor layer 428 may be doped with the n-type impurities or the p-type impurities depending on the structure of the NMOS or PMOS thin-film transistor. An NMOS or a PMOS thin-film transistor may be employed as the thin-film transistor included in the field emission display device according to the exemplary embodiment of the present disclosure.

A first insulating layer 431 may be made up of a single layer of silicon oxide (SiOx) or silicon nitride (SiNx) or a multilayer thereof and may be disposed to suppress the electric current flowing in the semiconductor layer 428 from flowing into the gate electrode 422. Silicon oxide is less flexible than metal but more flexible than silicon nitride and may be made up of a single layer or multiple layers depending on the characteristics.

The gate electrode 422 serves as a switch that turns on or off the thin-film transistor 420 based on an electric signal transmitted from an external element through the gate lines. The gate electrode 422 may be made up of a single layer or multiple layers of a conductive metal such as copper (Cu), aluminum (Al), molybdenum (Mo), chrome (Cr), gold (Au), titanium (Ti), nickel (Ni) and neodymium or an alloy thereof. It is, however, to be understood that the present disclosure is not limited thereto.

The source electrode 424 and the drain electrode 426 are connected to the data lines, allowing electric signals transmitted from an external element to be transmitted from the thin-film transistor 420 to the light-emitting element 440. The source electrode 424 and the drain electrode 426 may be made up of a single layer or multiple layers of a conductive metal such as copper (Cu), aluminum (Al), molybdenum (Mo), chrome (Cr), gold (Au), titanium (Ti), nickel (Ni) and neodymium or an alloy thereof. It is, however, to be understood that the present disclosure is not limited thereto.

To insulate the gate electrode 422 from the source electrode 424 and the drain electrode 426, a second insulating layer 433 made up of a single layer of silicon oxide (SiOx) or silicon nitride (SiNx) or multiple layers thereof may be disposed between the gate electrode 422 and the source electrode 424 and between the gate electrode 422 and the drain electrode 426.

A passivation layer made of an inorganic insulating layer such as silicon oxide (SiOx) and silicon nitride (SiNx) may be further disposed on the thin-film transistor 420. The passivation layer can suppress unnecessary electrical connection between the elements and contamination or damage from the outside. The passivation layer may be eliminated depending on the configuration and characteristics of the thin-film transistor 420 and the light-emitting element 440.

The thin-film transistor 420 may be classified into an inverted staggered structure and a coplanar structure depending on the positions of the constituent elements of the thin-film transistor 420. In the thin-film transistor of the inverted staggered structure, the gate electrode is located on the opposite side to the source electrode and the drain electrode with respect to the semiconductor layer. As shown in FIG. 4, in the thin-film transistor 420 of the coplanar structure, the gate electrode 422 is located on the same side with the source electrode 424 and the drain electrode 426 with respect to the semiconductor layer 428.

Although the thin-film transistor 420 of the coplanar structure is shown in FIG. 4, it may include a thin-film transistor of an inverted staggered structure.

For convenience of illustration, only the driving thin-film transistor is shown among various thin-film transistors, and a switching thin-film transistor, a capacitor, etc., may be included. When a signal is applied from the gate line, the switching thin-film transistor transfers a signal from the data line to the gate electrode of the driving thin-film transistor. The driving thin-film transistor transmits a current, which is transmitted through the supply voltage line, to the anode 442 by a signal received from the switching thin-film transistor, and controls the emission by the current transmitted to the anode 442.

Planarization layers 435 and 437 are disposed over the thin-film transistor 420 in order to protective the thin-film transistor 420, to reduce level difference formed by the thin-film transistor 420, and to reduce parasitic capacitance generated among the thin-film transistor 420 and the gate line and the data line and the light-emitting element 440.

The planarization layers 435 and 437 may be made of at least one of: an acrylic resin, an epoxy resin, a phenolic resin, a polyamide resin, a polyimide resin, an unsaturated polyester resin, a polyphenylene resin, a polyphenylene sulfides resin and benzocyclobutene resin. It is, however, to be understood that the present disclosure is not limited thereto.

According to the exemplary embodiment of the present disclosure, the display device 400 may include a plurality of planarization layers 435 and 437 stacked sequentially, e.g., a first planarization layer 435 and a second planarization layer 437.

For example, the first planarization layer 435 may be stacked on the thin-film transistor 420, and then the second planarization layer 437 may be stacked on the first planarization layer 435.

A buffer layer may be disposed on the first planarization layer 435. The buffer layer is disposed to protect the elements disposed on the first planarization layer 435 and may be made up of a single layer of silicon nitride (SiNx) or silicon oxide (SiOx) or multiple layers of silicon nitride (SiNx) and silicon oxide (SiOx). The buffer layer may be eliminated depending on the configuration and characteristics of the thin-film transistor 420 and the light-emitting element 440.

An intermediate electrode 430 is connected to the thin-film transistor 420 through a contact hole formed in the first planarization layer 435. The intermediate electrode 430 may be stacked to be connected to the thin-film transistor 420, and the data line may be formed in a multi-layer structure.

The data line may have a structure in which a lower layer made of the same material as the source electrode 424 and the drain electrode 426 is connected to an upper layer made of the same material as the intermediate electrode 430. Since the data lines can be implemented in a structure in which two layers are connected to each other in parallel, the line resistance of the data lines can be reduced.

A passivation layer made of an inorganic insulating layer such as silicon oxide (SiOx) and silicon nitride (SiNx) may be further disposed over the first planarization layer 435 and the intermediate electrode 430. The passivation layer can suppress unnecessary electrical connection between the elements on the passivation layer and contamination or damage from the outside. The passivation layer may be eliminated depending on the configuration and characteristics of the thin-film transistor 420 and the light-emitting element 440.

The light-emitting element 440 disposed on the second planarization layer 437 includes an anode 442, a light-emitting unit 444, and a cathode 446.

The anode 442 may be disposed on the second planarization layer 437. The anode 442 is an electrode serving to supply holes to the light-emitting unit 444 and is connected to the intermediate electrode 430 through a contact hole in the second planarization layer 437 and is electrically connected to the thin-film transistor 420.

The anode 442 may be formed of, but is not limited to, indium tin oxide (ITO), indium zinc oxide (IZO) or the like, which is a transparent conductive material.

When the field emission display device is of a top-emission display device where the cathode 446 emits light upward, it may further include a reflective layer so that the emitted light is reflected off the anode 442 to exit more efficiently toward the upper side where the cathode 446 is disposed.

For example, the anode 442 may be made up of a stack of two layers, e.g., a reflective layer and a transparent conductive layer made of transparent conductive material, or a stack of three layers, e.g., a transparent layer, a reflective layer and a transparent layer stacked on one another sequentially. The reflective layer may be made of silver (Ag) or an alloy of silver.

A bank 450 disposed on the anode 442 and the second planarization layer 437 may define a pixel by partitioning a region that actually emits light. The bank 450 is formed by forming a photoresist on the anode 442 and performing photolithography. A photoresist is a photosensitive resin whose solubility in a developer is changed by the action of light. A specific pattern can be obtained by exposing and developing the photoresist. The photoresist may be divided into a positive photoresist and a negative photoresist. The positive photoresist refers to a photoresist in which the solubility in developer increases by exposure. When the positive photoresist is developed, a pattern is obtained that the exposed portion is removed. The negative photoresist refers to a photoresist in which the solubility in developer greatly decreases by exposure. When the negative photoresist is developed, a pattern is obtained that the exposed portion remains.

A fine metal mask (FMM) may be used to form the light-emitting unit 444 of the light-emitting element 440 as a deposition mask. In order to prevent damage that may occur when the bank 450 is brought into contact with the deposition mask above it and to keep a constant distance between the bank 450 and the deposition mask, spacer 452 made of a transparent organic material such as polyimide, photoacrylic and benzocyclobutene (BCB) may be disposed.

The light-emitting unit 444 is disposed between the anode 442 and the cathode 446. The light-emitting unit 444 emits light and may include at least one of a hole injection layer (HIL), a hole transport layer (HTL), an emissive layer, an electron transport layer (ETL) and an electron injection layer (EIL). Some of the elements of the light-emitting unit 444 may be eliminated depending on the structure and characteristics of the field emission display device. It is to be noted that an electroluminescent layer and an inorganic luminescent layer may be employed as the emissive layer.

The hole injection layer may be disposed on the anode 442 to facilitate the injection of holes. The hole injection layer may be made of, but is not limited to, at least one selected from the group consisting of HAT-CN(dipyrazino[2,3-f:2',3'-h]quinoxaline-2,3,6,7,10,11-hexacarbonitrile), CuPc(phthalocyanine), and NPD(N,N'-bis(naphthalene-1-yl)-N,N'-bis(phenyl)-2,2'-dimethylbenzidine).

The hole transport layer may be disposed on the hole injection layer to facilitate the transportation of holes to the emissive layer. The hole transport layer may be made of, but is not limited to, at least one selected from the group consisting of NPD(N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine), s-TAD (2,2',7,7'-tetrakis(N,N-dimethylamino)-9,9-spirofluorene) and MTDATA (4,4',4"-Tris(N-3-methylphenyl-N-phenyl-amino)-triphenylamine).

The emissive layer may be disposed on the hole transport layer and may include a material that can emit light of a color to emit light of the color. The material may be formed by using a phosphorescence material or a fluorescence material.

When the emissive layer emit red light, the peak wavelength of the light emitted from the emissive layer may range from about 600 to 650 nm. The emissive layer may be made of a phosphorescence material that includes a host material including CBP (4,4'-bis(carbazol-9-yl)biphenyl) or mCP (1,3-bis(carbazol-9-yl)benzene) and a dopant including at least one of PIQIr(acac)(bis(1-phenylisoquinoline)(acetylacetonate) iridium), PQIr(acac)(bis(1-phenylquinoline)(acetylacetonate) iridium), PQIr(tris(1-phenylquinoline) iridium) and PtOEP(octaethylporphyrin platinum). Alternatively, the emissive layer may be made of a fluorescence material that includes PBD:Eu(DBM)3(Phen) or Perylene.

The peak wavelength (λ) refers to the maximum wavelength of EL (Electroluminescence). The wavelength at which the emissive layers forming the light-emitting unit emit light is referred to as PL (Photoluminescence). The light that is influenced by the thickness or the optical characteristics of the layers forming the emissive layers is referred to as an emittance. EL (Electroluminescence) refers to light finally emitted by the field emission display device, and can be expressed by a product of PL (Photoluminescence) and emittance.

When the emissive layer emits green light, the peak wavelength of the emitted light may range from about 520 nm to 540 nm, including host materials including CBP or mCP, and may be made of a fluorescent material that includes dopant materials such as Ir complex including Ir(ppy)3(tris(2-phenylpyridine) iridium. Further, it may be made of a fluorescent material containing Alq3(tris(8-hydroxyquinolino)aluminum).

When the emissive layer emits blue light, the peak wavelength of the emitted light may range from about 440 nm to 480 nm, including host materials including CBP or mCP, and may be made of a phosphorescent material that includes dopant materials such as FIrPic(bis(3,5-difluoro-2-(2-pyridyl)phenyl-(2-carboxypyridyl)iridium). In addition, it may be made of a phosphorescent material that includes one of spiro-DPVBi(4,4'-Bis(2,2-diphenyl-ethen-1-yl)biphenyl), DSA (1-4-di-[4-(N,N-di-phenyl)amino]styryl-benzene), PFO(polyfluorene) polymer and PPV(polyphenylenevinylene) polymer.

The electron transport layer is disposed on the emissive layer, to facilitate the mobility of electrons to the emissive layer. The electron transport layer may be made of at least one selected from the group consisting of: Liq(8-hydroxyquinolinolato-lithium), PBD (2-(4-biphenyl)-5-(4-tert-butylphenyl)-1,3,4-oxadiazole), TAZ (3-(4-biphenyl)4-phenyl-5-tert-butylphenyl-1,2,4-triazole), spiro-PBD, BCP (2,9-Dimethyl-4,7-diphenyl-1,10-phenanthroline) and BAlq(bis (2-methyl-8-quinolinolate)-4-(phenylphenolato) aluminium).

The electron injection layer may be further disposed on the electron transport layer. The electron injection layer is an organic layer that facilitates the injection of electrons from the cathode 446 and may be eliminated depending on the structure and characteristics of the field emission display device. The electron injection layer may be a metal inorganic compound such as $BaF_2$, LiF, NaCl, CsF, Li2O and BaO, and may be an organic compound at least one of HAT-CN (dipyrazino[2,3f:2',3'-h]quinoxaline-2,3,6,7,10.11-hexacarbonitrile), CuPc(phthalocyanine), and NPD(N,N'-bis(naphthalene-1-yl)-N,N'-bis(phenyl)-2,2'-dimethylbenzidine).

By further disposing an electron blocking layer or a hole blocking layer that blocks the flow of holes or electrons adjacent to the emissive layer, it is possible to prevent the phenomenon that electrons move from the emissive layer to pass through the adjacent hole transparent layer when the electrons are injected into the emissive layer or that holes move from the emissive layer to pass through the adjacent electron transparent layer when the holes are injected into the emissive layer, thereby improving the luminous efficiency.

The cathode 446 is disposed on the light-emitting unit 444 and serves to supply electrons to the light-emitting unit 444. To supply electrons, the cathode 446 may be formed of a metal material such as magnesium (Mg) and silver-magnesium (Ag:Mg), which is a conductive material having a low work function. It is, however, to be understood that the present disclosure is not limited thereto.

When the field emission display device is of a top-emission type, the cathode 446 may be a transparent conductive oxide such as indium tin oxide (ITO), indium zinc oxide (IZO), indium tin zinc oxide (ITZO), zinc oxide (ZnO) and tin oxide (TiO).

An encapsulation layer 460 may be disposed on the light-emitting element 440 to prevent the thin-film transistor 420 and the light-emitting element 440 from being oxidized or damaged due to external, foreign materials such as moisture, oxygen, or contaminants introduced from the outside. In one embodiment, the encapsulation layer 460 may be a single layer. However, in other embodiments, the encapsulation layer 460 may have a plurality of layers and include sub-layers. For example, the encapsulation layer 460 may be formed by stacking a plurality of encapsulation layers, a particle cover layer and a plurality of barrier films.

The encapsulation layer may be disposed throughout the entire upper surface of the thin-film transistor 420 and the light-emitting element 440 and may be made of silicon nitride (SiNx) or aluminum oxide (AlOx), which is an inorganic material. It is, however, to be understood that the present disclosure is not limited thereto.

Another encapsulation layer may be disposed on the particle cover layer disposed on the encapsulation layer.

The particle cover layer is disposed on the encapsulation layer and may be made of a resin such as such as silicon oxy carbon (SiOCx) and an acrylic or epoxy resin, which are an organic material. It is, however, to be understood that the present disclosure is not limited thereto. When a defect occurs due to foreign matter or particles possibly generated during the process, such irregularity or particles may be covered by the particle cover layer.

By disposing the barrier film on the encapsulation layer and the particle cover layer, it is possible to delay the permeation oxygen and moisture from the outside. The barrier film may be implemented as transparent, a double-sided film and may be made of an insulating material selected from the group consisting of olefin series, acrylic series and silicon series. Alternatively, an additional barrier film made of one of cycloolefin polymer (COP), a cycloolefin copolymer (COC) and a polycarbonate (PC) may be further disposed. It is, however, to be understood that the present disclosure is not limited thereto.

Figure 5:
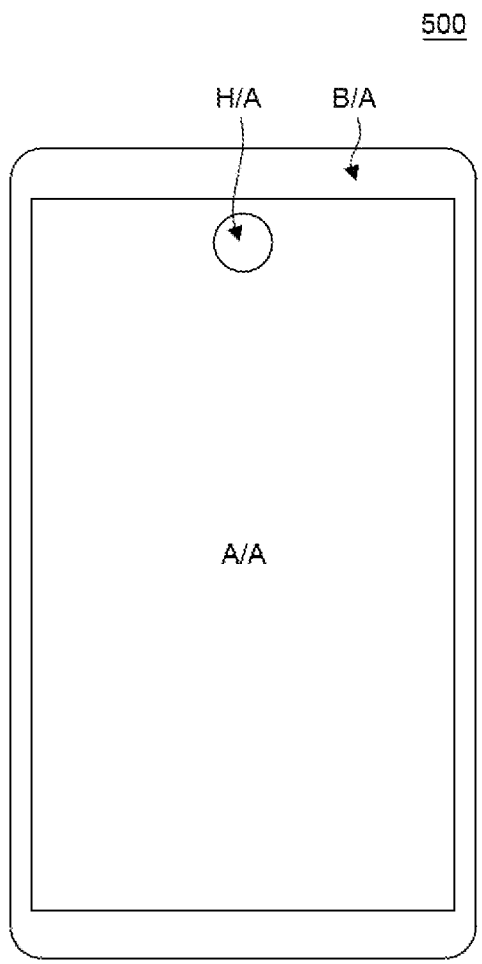
FIG. 5 is a plan view of a portable electronic device including a display device according to an exemplary embodiment of the present disclosure.

FIG. 5 is a plan view of a portable electronic device including a display device according to an exemplary embodiment of the present disclosure.

A smartphone is employed as the portable electronic device described with reference to FIG. 5, but the present disclosure is not limited thereto. The portable electronic device may be a tablet PC.

Referring to FIG. 5, the display device described above with reference to FIGS. 1 to 4 is disposed on the front face of a portable display device 500, such that the active area A/A where images are displayed, and non-active area surrounding the border of the active area A/A, which is a bezel area B/A, are disposed.

Recently, as demand for portable electronic devices such as smart phones and tablet PCs has been greatly increased, electronic devices which were separately used in the past have been integrated into a single portable electronic device, so that it has capturing capability like a camera, audio capability and a memo capability, along with communications capability like a phone, for a variety of applications.

In a portable electronic device, such as a smart phone and a tablet PC, a camera for capturing feature, an optical sensor, a speaker for an audio feature, and an audio module like a microphone may be disposed by forming a hole in a bezel area B/A which is the non-active area surrounding the border of the active area A/A, so that they can interact with the external environment and a user.

However, for recent portable electronic devices such as a smart phone and a tablet PC, it is required to have a larger size for the sake of user convenience to the extent that the user can easily carry it. In order to enlarge the size of display devices while allowing the user to carry it easily, there is an approach that a hole is formed in the active area A/A where images are actually displayed and modules performing a variety of features such as a camera and a sensor are disposed under the display device and exposed via the hole.

Unfortunately, when the hole is formed in the active area A/A of the display device, a hole area H/A may become vulnerable to permeation of moisture or contaminants from the outside. In particular, since the light-emitting element described with reference to FIG. 4 is very vulnerable to permeation of moisture or contaminants from the outside, the inventors of the present disclosure have devised a display device having a novel structure that can prevent permeation of moisture or contaminants through the hole area H/A in the active area A/A of the display device.

The cross-sectional structure and a process of forming the hole area H/A included in the active area A/A of the display device 500 will be described in detail with reference to FIGS. 6A to 6D.

FIGS. 6A to 6D are cross-sectional views illustrating a process of fabricating a display device according to one embodiment of the present disclosure.

Figure 6A:
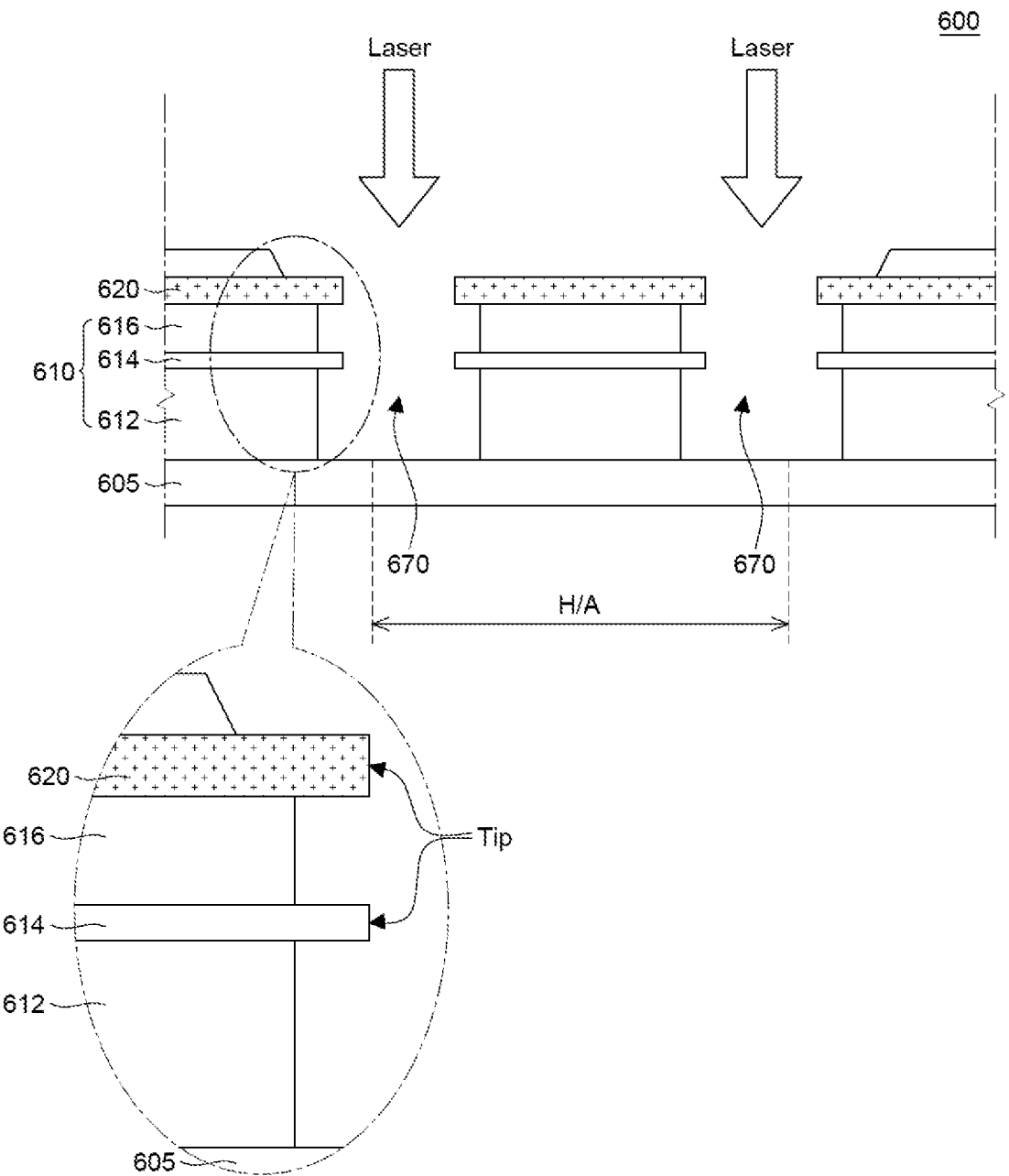
FIGS. 6A, 6B, 6C and 6D are cross-sectional views showing a process of fabricating a display device according to an exemplary embodiment of the present disclosure.

Some of the elements of FIGS. 6A to 6D are substantially identical to those described above with reference to FIGS. 1 to 5; and, therefore, the redundant description will be omitted Referring to FIG. 6A, a flexible substrate 610 made of a material having pliability, flexibility is disposed on a supporting substrate 605 made of a rigid material such as glass.

The flexible substrate 610 may be in the form of a film including one of a polyester-based polymer, a silicon-based polymer, an acrylic polymer, a polyolefin-based polymer, and a copolymer thereof, and usually may be made of polyimide.

In one or more embodiments, the flexible substrate 610 includes a first substrate layer 612 and a second substrate layer 616 made of polyimide and a substrate protecting layer 614 between the first substrate layer 612 and the second substrate layer 616, so that it is possible to prevent permeation of moisture and contaminants through the flexible substrate 610 from the outside. The substrate protecting layer 614 may be, but is not limited to, an inorganic insulating layer such as silicon oxide (SiOx) and silicon nitride (SiNx). However, in other embodiments, the flexible substrate 610 can include more than first and second substrate layers 612 and 616. For example, the flexible substrate 610 can include a third substrate layer and having an additional substrate protecting layer in between the third substrate layer and the adjacent substrate layer (e.g., either a first substrate layer 612 or a second substrate layer 616).

The elements of the field emission display device including the thin-film transistor described above with reference to FIG. 4 are sequentially formed on the flexible substrate 610. At the same time, a first common layer 620 is formed in the hole area H/A and around it, which is, in some embodiments, the same layer as the thin-film transistor and includes a metal layer and inorganic insulating layer that are elements of the thin-film transistor.

To form the hole area H/A in the active area A/A described above with reference to FIG. 5, a laser is irradiated along the border of the area where the hole area H/A is formed, to remove the first common layer 620 and the flexible substrate 610 and form a groove 670 or a plurality of grooves 670.

In one embodiment, the layer in which the thin-film transistor is formed is the first common layer 620. The thin-film transistor includes a metal layer, inorganic insulating layer, and other layers (e.g., semiconductor layer). The first common layer 620 may also include these layers. The first common layer 620 and the substrate protecting layer 614 of the flexible substrate 610 have a higher melting point than the first substrate layer 612 and the second substrate layer 616 which are made of polyimide. Therefore, when the laser is irradiated for a same period of time, the first substrate layer 612 and the second substrate layer 616 is removed more than the substrate protecting layer 614.

In the groove 670 after the first common layer 620 and the flexible substrate 610 have been removed, the thin film first common layer 620 and the substrate protecting layer 614 protrude from the cross sections of the first substrate layer 612 and the second substrate layer 616, to form tips. For example, due to the higher melting point of the substrate protecting layer 614 than the first and second substrate layer 612, 616, after removal using the laser, the structure results in the first common layer 620 and the substrate protecting layer 614 protruding laterally in a direction towards the groove 670. A first tip and a second tip are formed after the removal of the first substrate layer 612 and the second substrate layer 616. The first tip is formed at one end of the substrate protecting layer 614. The first tip protrudes toward the side or side wall of the groove 670. Similarly, the second tip is formed at one end of the first common layer 620. The second tip protrudes toward the groove 670.

Figure 6B:
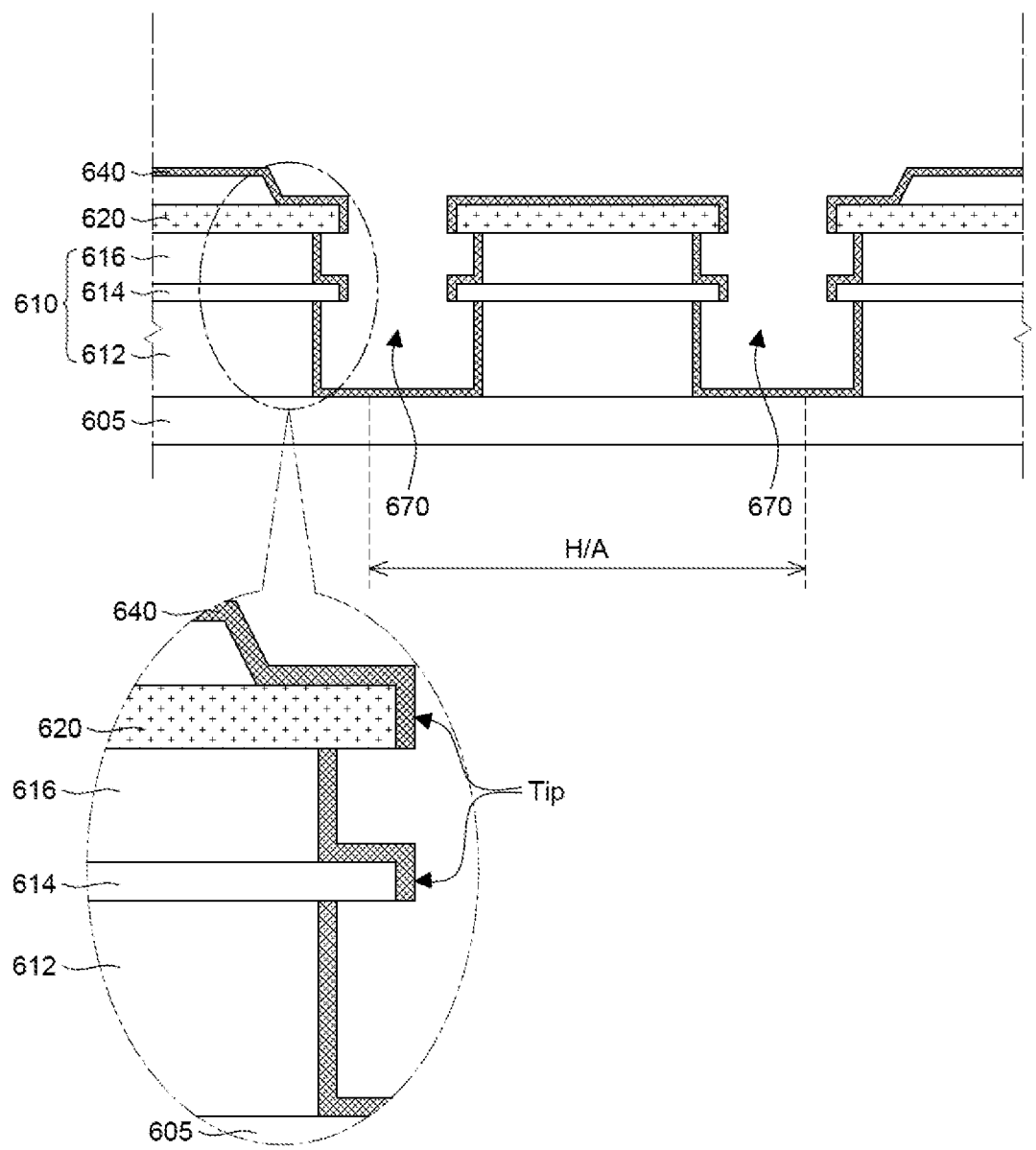
Figure 6C:
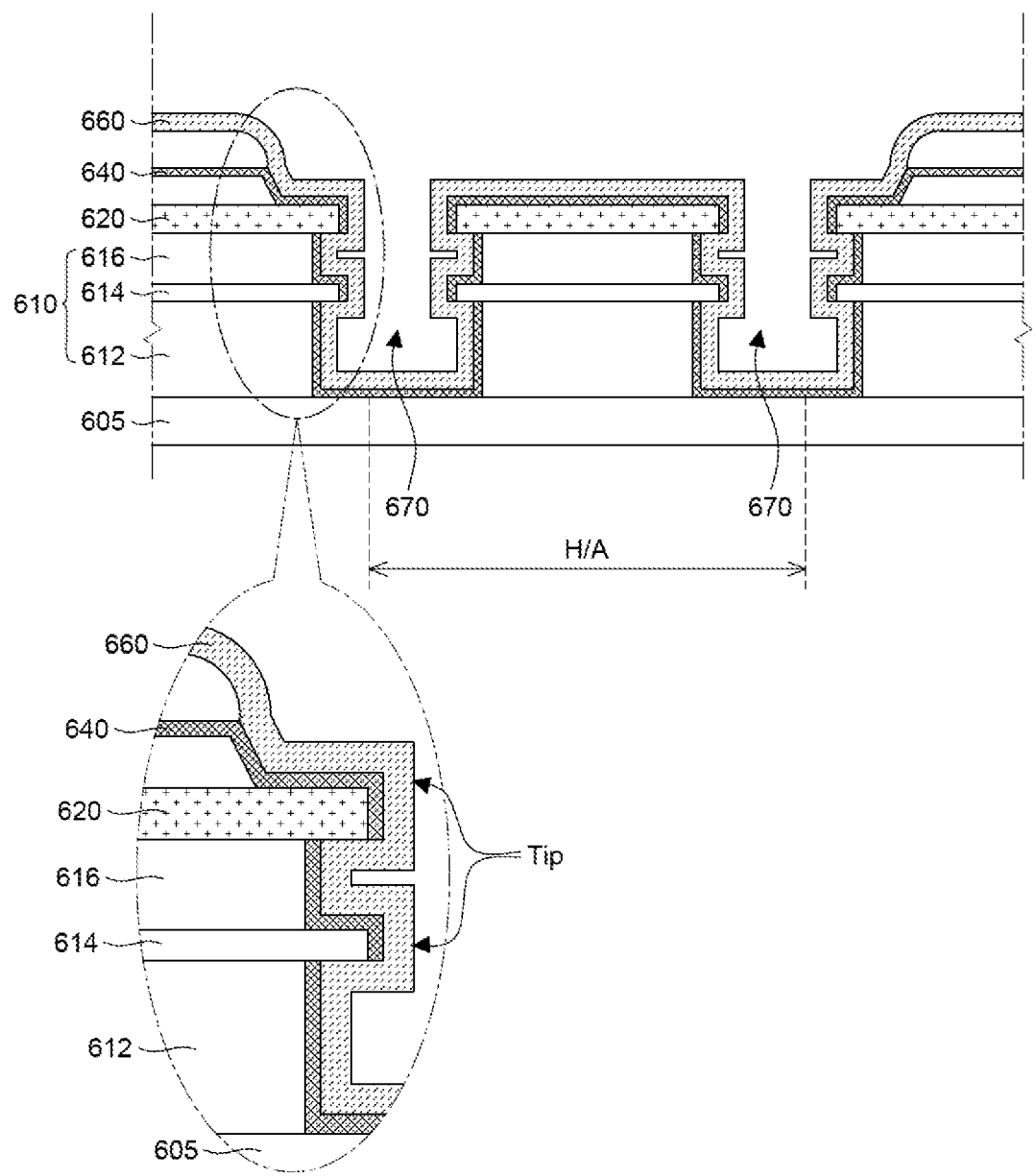

In one or more embodiments, the first tip and the second tip each have a top surface, a side surface that faces the side of the groove 670, and a bottom surface. As shown in FIG. 6B, a second common layer 640 covers the top surfaces and the side surfaces of the first and second tips. However, the second common layer 640 does not cover the bottom surfaces of the first and second tips. The bottom surface of the first tip is not covered by the second common layer 640 and leaves a portion of the substrate protecting layer 614 exposed. In addition, the bottom surface of the second tip is not covered by the second common layer 640 and leaves a portion of the first common layer 620 exposed. In FIG. 6C, an encapsulation layer 660 is applied on the first common layer 620 and the flexible substrate 610. In this embodiment, the encapsulation layer 660 covers bottom surfaces of the first tip and the second tip that was not covered by the second common layer 640.

In one or more embodiments, the shape of the tip can be in various shapes depending on the tools and equipment used to remove part of the flexible substrate 610. For example, the shape of the tip can be in a rectangular shape but the tip is not limited to being formed in this shape. The tip can have a triangular shape, a partially round shape, and any other shape that results as the removal process.

Referring to FIG. 6B, the light-emitting element described above with reference to FIG. 4 and a second common layer 640 formed, in some embodiments, as the same layer as the light-emitting element are disposed on the flexible substrate 610 and the first common layer 620.

The light-emitting element is very vulnerable to moisture permeating from the outside. As the light-emitting element is disposed in the active area A/A of a display device 600 by deposition, the second common layer 640 which is formed in the same manner as the elements of the light-emitting element described above with reference to FIG. 4 is disposed in the hole area H/A included in the active area A/A by deposition.

Since the hole area H/A is exposed to the outside, moisture may permeate into the light-emitting element in the active area A/A through the second common layer 640 that is connected thereto and disposed adjacent to the hole area H/A, which may result in defects.

In view of the above, according to one embodiment of the present disclosure, tips are formed that protrude from the cross sections of the first substrate layer 612 and the second substrate layer 616 in the hole area H/A in the active area A/A of the display device 600, so that the light-emitting element is not connected to the second common layer 640 where the tips are formed. When the substrate 610 is made up of a single layer, only a tip extended from the first common layer 620 may be formed. When the substrate 610 is made up of double layers, a tip extended from the substrate protecting layer 614 may be added. It is, however, to be understood that the present disclosure is not limited thereto.

In some embodiments, the second common layer 640 is not formed under the tips, and thus the light-emitting element disposed on the active area A/A may be disconnected from the second common layer 640. Even if moisture permeates into the hole area H/A exposed to the outside, the light-emitting element is disconnected from the second common layer 640 where the tip is disposed, such that the path in which the moisture may permeate can be blocked. Accordingly, it is possible to prevent defects that may occur due to the permeation of moisture into the light-emitting element. Throughout the present disclosure, "disconnected" may broadly encompass the meaning of being physically disconnected, electrically disconnected, or electrically isolated in some embodiments.

Referring to FIG. 6C, the encapsulation layer 660 described above with reference to FIG. 4 is deposited on the active area A/A and the hole area H/A of the display device 600. The encapsulation layer 660 is also deposited on the side surfaces of the groove 670 to prevent permeation of moisture from the outside through the hole area H/A.

As described above with reference to FIG. 4, the encapsulation layer 660 may be formed by stacking a plurality of encapsulation layers, a particle cover layer and a plurality of barrier films, and may be formed on the entire active area A/A including the side surfaces of the groove 670. The height of the tips and the thickness of the encapsulation layer 660 may be adjusted so that the encapsulation layer 660 is continuous without being disconnected over the tips.

As described above with reference to FIG. 6B, even if moisture permeates through the encapsulation layer 660 from the side surfaces of the groove 670, the light-emitting element is not connected to the second common layer 640 where the tips are formed, such that the path in which moisture may permeate into the light-emitting element can be blocked. As a result, it is possible to block the path together with the encapsulation unit 660, thereby preventing defects that may occur due to the permeation of moisture.

Figure 6D:
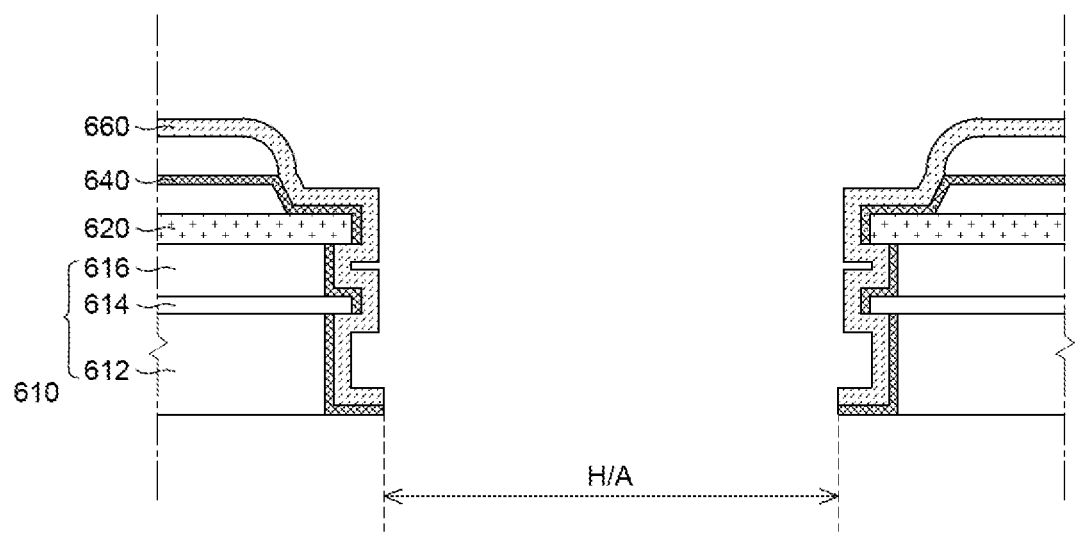

Referring to FIG. 6D, the supporting substrate 605 made of a rigid material such as glass is separated and released. In doing so, the elements disposed in the groove 670 are removed together, so that the hole area H/A can be formed in the active area A/A of the display device 600. In some embodiments, a laser can be applied to multiple portions of the flexible substrate 610. The laser may form a plurality of grooves 670. When the structures (e.g., flexible substrate 610, first common layer 620, second common layer 640, the encapsulation layer 660, etc.) between the plurality of grooves 670 are removed, a recess is formed on the supporting substrate 605. After the supporting substrate 605 is removed, a hole that corresponds to the size of the recess may be formed.

The first and second common layers can be composed of a plurality of layers and sub-layers even though they are referred to herein as being a layer. The term layer as used herein being in the broadest sense to include a layer that has one or more sub-layers.

The various embodiments of the present disclosure can also be described as follows:

According to an aspect of the present disclosure, there is provided a display device. The display device comprises a flexible substrate comprising an active area, and a non-active area surrounding a border of the active area, a thin-film transistor and a light-emitting element on the active area, an encapsulation unit over the thin-film transistor and the light-emitting element, a hole formed in the active area by removing a portion of the flexible substrate, a first common layer disposed on a side surface of the hole, extended from the light-emitting element and comprising same elements with the light-emitting element, and a tip protruding from the side surface of the hole, and the first common layer is disposed adjacent to the tip is disconnected from the light-emitting element.

The first common layer may be disconnected under the tip.

The flexible substrate may be made of polyimide.

The flexible substrate may be formed by stacking a plurality of layers of polyimide.

The flexible substrate may further comprise the plurality of layers of polyimide stacked on one another and an inorganic insulating layer disposed between the layers of the polyimide.

The tip may be configured to the inorganic insulating layer.

The display device may further comprise a second common layer comprising at least some of the components of the thin-film transistor, and the second common layer may be disposed adjacent to the hole and the tip may be configured to the second common layer.

The encapsulation unit may be disposed on the side surface of the hole.

The encapsulation unit may comprise at least one of an encapsulation layer, a particle cover layer, and a barrier film.

According to another aspect of the present disclosure, there is provided a method of fabricating a display device. The method comprises forming a flexible substrate on a supporting substrate, the flexible substrate comprising an active area and a non-active area surrounding a border of the active area, forming a thin-film transistor on the active area, forming a groove by irradiating a portion of the active area with a laser to remove the flexible substrate and the thin-film transistor, forming a light-emitting element on the flexible substrate and the thin-film transistor and forming a first common layer on a side surface of the groove, the first common layer being extended from the light-emitting element and comprising same elements as the light-emitting element, forming an encapsulation unit on the light-emitting element, and forming a hole corresponding to the groove by removing the supporting substrate, and the forming the groove further comprises forming a tip protruding from the side surface of the groove, and the first common layer disposed adjacent to the tip is disconnected from the light-emitting element.

The first common layer may be disconnected under the tip.

The flexible substrate may be made of polyimide.

The forming the flexible substrate may comprise forming the flexible substrate by stacking a plurality of layers of polyimide.

The method may further comprise forming an inorganic insulating layer between the layers of polyimide.

The tip may be extended from the inorganic insulating layer.

The method may further comprise a second common layer comprising at least some of the components of the thin-film transistor adjacent to the hole, and the tip may be extended from the second common layer.

Further aspect of the present disclosure is provided. One aspect of the present disclosure provides a display device. The display device includes: a flexible substrate including an active area, and a non-active area adjacent to the active area; a thin-film transistor on the active area; a light-emitting element coupled to the thin-film transistor on the active area; an encapsulation layer on the thin-film transistor and the light-emitting element; a hole in the active area, the hole having a side surface; a first common layer including at least one or more components of the thin-film transistor and the light-emitting element; a second common layer including at least at least one or more components of the light-emitting element, wherein the second common layer is on the first common layer; and a tip extended from the first common layer, wherein the tip protrudes towards the side surface of the hole.

In one embodiment, the tip is disconnected from the light-emitting element.

In one embodiment, the first common layer is disconnected at the tip.

In one embodiment, the flexible substrate is made of polyimide.

In one embodiment, the flexible substrate is formed by stacking a plurality of layers of polyimide.

In one embodiment, the flexible substrate further includes the plurality of layers of polyimide stacked on one another and an inorganic insulating layer disposed between the layers of the polyimide.

In one embodiment, the tip is formed by the inorganic insulating layer.

In one embodiment, the second common layer is disposed adjacent to the hole and the second common layer partially covers the tip.

In one embodiment, the encapsulation layer is disposed on the side surface of the hole.

In one embodiment, the encapsulation layer is a combination of a plurality of layers, wherein the plurality of layers include at least one of an encapsulation layer, a particle cover layer, and a barrier film.

Further aspect of the present disclosure provides a method of fabricating a display device. The method includes the steps of: forming a flexible substrate on a supporting substrate; forming a thin-film transistor on the flexible substrate; forming a plurality of grooves by irradiating a portion of the flexible substrate with a laser; removing the portion of the flexible substrate and the thin-film transistor irradiated with the laser; forming a light-emitting element connected to the thin-film transistor; forming a first common layer having a tip protruding towards a side surface of a groove of the plurality of grooves, wherein the first common layer extends from a layer including the light-emitting element; removing the flexible substrate formed between the plurality of grooves to form a recess in the flexible substrate; removing the supporting substrate; forming a hole corresponding to the recess.

In one embodiment, the tip of the first common layer is disconnected from the light-emitting element.

In one embodiment, the first common layer is disconnected under the tip.

In one embodiment, the flexible substrate is made of polyimide.

In one embodiment, the step of forming the flexible substrate includes the step of forming the flexible substrate by stacking a plurality of layers of polyimide.

The method further includes the steps of: forming an inorganic insulating layer between the layers of polyimide; and forming an encapsulation layer on the flexible substrate and the first common layer.

In one embodiment, the tip is extended from the inorganic insulating layer.

The method further includes the steps of: forming a second common layer including the thin-film transistor adjacent to the hole, and wherein the tip is extended from the second common layer.

Yet another aspect of the present disclosure provides a display device. The display device includes: a flexible substrate including a first substrate layer, a second substrate layer, and a substrate protecting layer between the first substrate layer and the second substrate layer; a first common layer on the flexible substrate, the first common layer including a thin-film transistor within the first common layer; a hole in a portion of the flexible substrate, wherein the hole has a side wall, and the hole spaces apart the flexible substrate, the first common layer, and the second common layer; a first tip extended from the substrate protecting layer, wherein the first tip protrudes towards the side wall of the hole; a second tip extended from the first common layer, wherein the second tip protrudes towards the side wall of the hole; and a second common layer on the first common layer, the second common layer including a light-emitting element within the second common layer.

In one embodiment, the second common layer partially covers the first tip and the second tip.

In one embodiment, the first tip has a top surface, a side surface, and a bottom surface.

In one embodiment, the second common layer covers only the top surface and the side surface of the first tip.

The display device further includes an encapsulation layer on the second common layer.

In one embodiment, the encapsulation layer covers the bottom surface of the first tip.

In one embodiment, the encapsulation layer forms the side wall of the hole.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. Further changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
    a flexible substrate including an active area, and a non-active area adjacent to the active area;
    a thin-film transistor on the active area;
    a light-emitting element coupled to the thin-film transistor on the active area;
    an encapsulation layer on the thin-film transistor and the light-emitting element;
    a hole in the active area, the hole having a side surface abutting the encapsulation layer;
    a first common layer including at least one or more components of the thin-film transistor; and
    a second common layer including at least one or more components of the light-emitting element,
    wherein the flexible substrate includes a first substrate layer, a second substrate layer disposed on the first substrate layer, and a substrate protecting layer between the first substrate layer and the second substrate layer,
    wherein the second common layer is on the first common layer, wherein the first common layer includes a first tip, the first tip having a top surface, a bottom surface opposite the top surface, and a side surface between the top surface and the bottom surface, the first tip protruding further horizontally than a side surface of the second substrate layer adjacent to the first tip, the first tip and the side surface of the second substrate layer forming a first undercut region,
    wherein the substrate protecting layer includes a second tip, the second tip having a top surface, a bottom surface opposite the top surface, and a side surface between the top surface and the bottom surface, the second tip protruding further horizontally than a side surface of the first substrate layer adjacent to the second tip, the second tip and the side surface of the first substrate layer forming a second undercut region,
    wherein the second common layer extends continuously from the top surface of the first tip to the side surface of the first tip, covers an entirety of the side surface of the first tip from a lateral direction, and is laterally adjacent to the side surface of the second substrate,
    the second common layer extends continuously from the side surface of the second substrate layer to the side surface of the second tip and covers an entirety of the side surface of the second tip from the lateral direction, and
    the second common layer covers the side surface of the first substrate layer from the lateral direction,
    wherein at least a portion of the bottom surface of the first tip is not covered by the second common layer in the first undercut region and at least a portion of the bottom surface of the second tip is not covered by the second common layer in the second undercut region, and
    wherein the encapsulation layer is disposed on the second common layer in the non-active area, and is continuously disposed from an upper portion of the second common layer to the side surface of the second substrate layer without being disconnected.

2. The display device of claim 1, wherein the first substrate layer and the second substrate layer are made of polyimide.

3. The display device of claim 1, wherein the encapsulation layer is a combination of a plurality of layers, wherein the plurality of layers include at least one of an encapsulation layer, a particle cover layer, and a barrier film.

4. A display device, comprising:
    a flexible substrate including a first substrate layer, a second substrate layer disposed on the first substrate layer, and a substrate protecting layer between the first substrate layer and the second substrate layer;
    a first common layer on the flexible substrate, the first common layer including a thin-film transistor within the first common layer;
    a hole extending through each layer of the flexible substrate and the first common layer, the hole having a side surface; and
    a second common layer on the first common layer, the second common layer including a light-emitting element within the second common layer,
    wherein the substrate protecting layer includes a first tip, the first tip protruding further horizontally than a first side surface of the first substrate layer and a second side surface of the second substrate layer, the first tip having a top surface, a bottom surface opposite the top surface, and a side surface between the top surface and the bottom surface, the first tip and the first side surface of the first substrate layer forming a first undercut region;
    wherein the first common layer includes a second tip, the second tip protruding further horizontally than the second side surface of the second substrate layer, the second tip having a top surface, a bottom surface opposite the top surface, and a side surface between the top surface and the bottom surface, the second tip and the second side surface of the second substrate layer forming a second undercut region; and
    wherein the second common layer at least partially covers the first tip and the second tip, wherein the second common layer extends continuously from the top surface of the first tip to the side surface of the first tip,
    wherein the second common layer covers the first side surface of the first substrate layer from a lateral direction, and
    wherein the second common layer covers an entirety of the side surface of the second tip from the lateral direction, and extends continuously from the side surface of the second substrate layer to the side surface of the second tip,
    wherein at least a portion of the bottom surface of the first tip is not covered by the second common layer in the first undercut region and at least a portion of the bottom surface of the second tip is not covered by the second common layer in the second undercut region, and
    wherein an encapsulation layer is disposed on the second common layer in the non-active area and is continuously disposed from an upper portion of the second common layer to the side surface of the second substrate layer without being disconnected.

5. The display device of claim 4, wherein the encapsulation layer covers the bottom surface of the first tip.

6. The display device of claim 5, wherein the encapsulation layer forms the side surface of the hole.

* * * * *